US010908028B2

(12) United States Patent
Kwon

(10) Patent No.: US 10,908,028 B2
(45) Date of Patent: Feb. 2, 2021

(54) TEMPERATURE SENSING CIRCUIT AND SEMICONDUCTOR DEVICE HAVING THE SAME

(71) Applicant: SK hynix Inc., Gyeonggi-do (KR)

(72) Inventor: Chan Keun Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 350 days.

(21) Appl. No.: 15/993,184

(22) Filed: May 30, 2018

(65) Prior Publication Data

US 2019/0120698 A1 Apr. 25, 2019

(30) Foreign Application Priority Data

Oct. 23, 2017 (KR) ........................ 10-2017-0137665

(51) Int. Cl.
*G01K 7/00* (2006.01)
*G01K 15/00* (2006.01)
*H03M 1/06* (2006.01)

(52) U.S. Cl.
CPC ............ *G01K 7/00* (2013.01); *H03M 1/0626* (2013.01); *G01K 2219/00* (2013.01)

(58) Field of Classification Search
USPC ............. 374/170, 1, 171, 172; 327/512, 513
See application file for complete search history.

(56) References Cited

U.S. PATENT DOCUMENTS 7,643,889 B2 * 1/2010 Jeong ........................ G01K 7/01 374/170
2008/0043810 A1 * 2/2008 Vogt ......................... G01K 1/02 374/170
2008/0095213 A1 * 4/2008 Lin ......................... G01K 7/015 374/170
2009/0323758 A1 * 12/2009 Im ............................ G01K 7/01 374/100
2010/0124251 A1 * 5/2010 Peterson .................. G01K 7/01 374/171
2013/0070805 A1 3/2013 Coln et al.
2013/0272340 A1 10/2013 Chern et al.
2015/0003490 A1 1/2015 Ash et al.
2015/0063403 A1 * 3/2015 Cho ....................... G01K 1/028 374/1
2016/0336947 A1 11/2016 Ma
(Continued)

FOREIGN PATENT DOCUMENTS

CN 102853931 A 1/2013
CN 106840462 A 6/2017
(Continued)

OTHER PUBLICATIONS

Office Action was issued by China National Intellectual Property Administration dated Mar. 31, 2020.

*Primary Examiner* — Mirellys Jagan
(74) *Attorney, Agent, or Firm* — IP & T Group LLP

(57) ABSTRACT

Provided herein may be a temperature sensing circuit and a semiconductor device having the same. The temperature sensing circuit may include an analog voltage generation circuit configured to convert a temperature into a voltage and output a temperature voltage, an analog-digital converter configured to convert the temperature voltage into a digital code, and a compensation circuit configured to adjust the digital code and then output an operation code to remove noise from the temperature voltage.

19 Claims, 7 Drawing Sheets

(56) References Cited

U.S. PATENT DOCUMENTS

| | | | | |
|---|---|---|---|---|
| 2017/0023416 | A1 | 1/2017 | Kim et al. | |
| 2019/0170592 | A1 * | 6/2019 | Jeong .................. | H03F 3/45179 |

FOREIGN PATENT DOCUMENTS

| | | | |
|---|---|---|---|
| JP | 2013-205085 | A | 10/2013 |
| KR | 1020070087516 | | 8/2007 |
| KR | 1020150027414 | | 3/2015 |

* cited by examiner

TEMPERATURE SENSING CIRCUIT AND SEMICONDUCTOR DEVICE HAVING THE SAME

CROSS-REFERENCE TO RELATED APPLICATION

The present application claims priority to Korean patent application number 10-2017-0137665 filed on Oct. 23, 2017, disclosure of which is incorporated herein by reference in its entirety.

BACKGROUND

1. Field of Invention

Various embodiments of the present disclosure generally relate to a temperature sensing circuit. Particularly, the embodiments relate to a temperature sensing circuit that converts a temperature into a digital code.

2. Description of the Related Art

A memory system may include a memory device in which data is stored and a memory controller which controls communication between the memory device and a host. For example, the memory system may perform a program operation, a read operation, or an erase operation in response to a command received from the host. In order for the memory system to perform a specific operation in response to the command, voltages may be set in advance according to an environment in which the memory system is operated.

The memory system may include a plurality of transistors, characteristic of which may be greatly influenced by temperature. For example, the electrical characteristics of the transistors may vary depending on temperature. Accordingly, the memory system may include a temperature sensing circuit for converting temperature into a temperature code and outputting the temperature code.

Since the temperature sensing circuit converts temperature into a digital code, the reliability of voltages outputted from a semiconductor device may vary depending on the accuracy of the code. Therefore, greater reliability of a code outputted from the temperature sensing circuit is needed.

SUMMARY

Various embodiments of the present disclosure are directed to a temperature sensing circuit, which performs digital calculation on a digital code, which is outputted by converting temperature into a digital signal, thus removing noise from a voltage that is outputted depending on temperature.

An embodiment of the present disclosure may provide a temperature sensing circuit. The temperature sensing circuit may include an analog voltage generation circuit configured to convert a temperature into a voltage and output a temperature voltage, an analog-digital converter configured to convert the temperature voltage into a digital code, and a compensation circuit configured to adjustthe digital code and then output an operation code to remove noise from the temperature voltage.

An embodiment of the present disclosure may provide for a semiconductor device. The semiconductor device may include a temperature sensing circuit configured to convert a temperature into a digital code, adjustthe digital code through a digital calculation, and then output an operation code, and a voltage generation circuit configured to output a voltage depending on the operation code.

DETAILED DESCRIPTION

Figure 1:
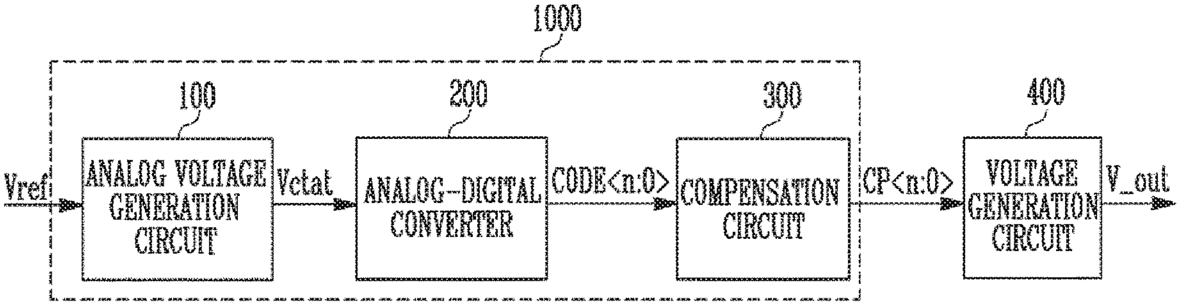
FIG. 1 is a diagram illustrating a temperature sensing circuit according to an embodiment of the present disclosure.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough, complete, and fully convey the present invention to those skilled in the art to which this invention pertains. Throughout the disclosure, like reference numerals refer to like parts throughout the various figures and embodiments of the present invention.

It will be understood that when an element is referred to as being “coupled” or “connected” to another element, it can be directly coupled or connected to the other element or intervening elements may be present therebetween. In the specification, when an element is referred to as “comprising” or “including” a component, it does not preclude another component but may further include other components unless the context clearly indicates otherwise.

The terminology used herein is for the purpose of describing particular embodiments only and is not intended to be limiting of the present invention.

As used herein, singular forms may include the plural forms as well, unless the context clearly indicates otherwise.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a diagram illustrating a temperature sensing circuit 1000 according to an embodiment of the present disclosure.

Referring to FIG. 1, the temperature sensing circuit 1000 may output a compensation code CP<n:0>, which is adjusted from a digital code CODE<n:0>. The digital code CODE<n:0> may be converted from a temperature voltage Vctat that varies with temperature value. A voltage generation circuit 400 may output an output voltage V_out depending on the compensation code CP<n:0>. In the present embodiment, the temperature sensing circuit 1000 may output the compensation code CP<n:0>, which adjusted from the digital code CODE<n:0> through a digital calculation, and thus the voltage generation circuit 400 may output a noise-removed output voltage V_out based on the compensation code CP<n:0>.

For this operation, the temperature sensing circuit 1000 may include an analog voltage generation circuit 100, an analog-digital converter 200, and a compensation circuit 300.

The analog voltage generation circuit 100 may be supplied with a reference voltage Vref, and may output the temperature voltage Vctat based on the temperature. For example, the analog voltage generation circuit 100 may output the temperature voltage Vctat inversely proportional to the temperature. For another example, the analog voltage generation circuit 100 may linearly output the temperature voltage Vctat depending on the temperature. That is, the analog voltage generation circuit 100 may output the temperature voltage Vctat having an analog waveform that varies with the temperature value.

The analog-digital converter 200 may convert the temperature voltage Vctat into a digital code CODE<n:0>. The digital code CODE<n:0> may be outputted as n-bit data (where n is a positive integer). In order to improve the reliability of the temperature sensing circuit 1000, the analog-digital converter 200 may be implemented as an analog-to-digital converter (ADC) having a high resolution. For this operation, the analog-digital converter 200 may generate a digital code CODE<n:0> having a resolution of 10 bits or more.

The compensation circuit 300 may adjust the digital code CODE<n:0> and output a compensation code CP<n:0> to remove noise attributable to various variables from the temperature voltage Vctat. For example, due to the noise attributable to various variables, the temperature voltage Vctat may be nonlinearly output, although it is ideal that the temperature voltage Vctat output from the analog voltage generation circuit 100 is linearly output. Therefore, since the nonlinear characteristics of the temperature voltage Vctat are reflected "as is" in the digital code CODE<n:0>, the compensation circuit 300 may remove such noise through a digital calculation, and may then output the compensation code CP<n:0>. A digital calculation method performed by the compensation circuit 300 will be described in detail later with reference to FIGS. 5 to 7.

Figure 2:
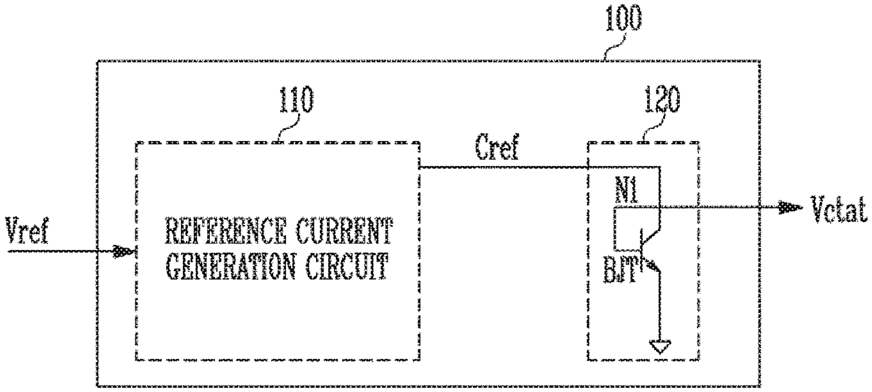
FIG. 2 is a diagram illustrating in detail an analog voltage generation circuit of FIG. 1.

FIG. 2 is a diagram illustrating in detail the analog voltage generation circuit 100 of FIG. 1.

Referring to FIG. 2, the analog voltage generation circuit 100 may include a reference current generation circuit 110 and a voltage conversion circuit 120.

The reference current generation circuit 110 may be supplied with a reference voltage Vref to generate a reference current Cref. The circuit for generating the reference current Cref based on the reference voltage Vref may be implemented in various forms, and thus a detailed description thereof will be omitted.

The voltage conversion circuit 120 may generate a temperature voltage Vctat based on the reference current Cref and the temperature. More specifically, the voltage conversion circuit 120 may generate a voltage depending on the reference current Cref, and may include a bipolar junction transistor (BJT) that is capable of generating a voltage inversely proportional to the temperature. The MT may be implemented as an NPN-type transistor. For example, the base and collector of the BIT may be coupled in common to a first node N1, and the emitter of the MT may be coupled to a ground node. When a current path is formed in the BIT using the reference current Cref, a voltage inversely proportional to the temperature is formed between both ends of the BIT, that is, the collector and the emitter thereof. Accordingly, the voltage of the first node N1 may be outputted as a compensation voltage Vctat that is inversely proportional to the temperature.

When the above-described temperature voltage Vctat is nonlinearly outputted, an output voltage V_out that is outputted from the voltage generation circuit 400 may also be nonlinearly outputted. This will be described in detail below with reference to FIG. 3.

Figure 3:
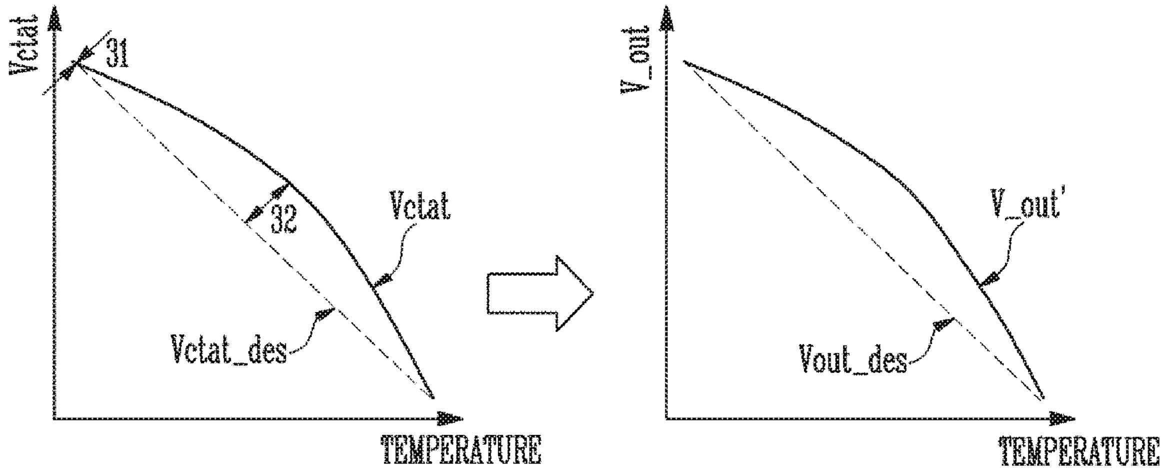
FIG. 3 is a diagram explaining output voltages attributable to noise.

FIG. 3 is a diagram explaining output voltages attributable to noise.

Referring to FIG. 3, as the analog voltage generation circuit 100 outputs temperature voltages Vctat inversely proportional to temperature, and the temperature voltages Vctat may be decreased as the temperature is increased. Ideally, when the temperature is uniformly (linearly) increased, the temperature voltages Vctat should also be uniformly decreased as Vctat_des. However, in reality, the temperature voltages Vctat (i.e., real temperature voltages) are outputted as nonlinear voltages having a curved waveform due to various types of environmental limitations of a semiconductor device. Therefore, a temperature point 31 in which differences between the real temperature voltages Vctat and ideal temperature voltages Vctat_des are small and a temperature point 32 in which the differences are large may be present.

Since the analog-digital converter 200 converts the nonlinear temperature voltages Vctat into a digital code CODE<n:0>"as is" and then outputs the digital code CODE<n:0>, the voltage generation circuit 400 may output nonlinear output voltages V_out' based on the digital code CODE<n:0> when a compensation circuit 300 is not present. Ideally, the voltage generation circuit 400 should output linear ideal output voltages Vout_des inversely proportional to temperature change, but nonlinear output voltages V_out' may be outputted due to the digital code CODE<n:0> having nonlinear characteristics.

Accordingly, in the present embodiment, the compensation circuit 300 provides output voltages V_out that is closest to the ideal output voltages Vout_des. The compensation circuit 300 will be described in detail below.

Figure 4:
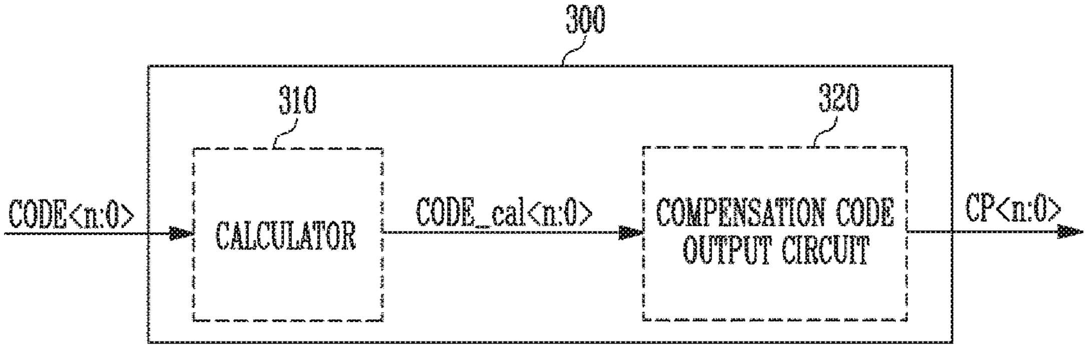
FIG. 4 is a diagram illustrating in detail a compensation circuit of FIG. 1.

FIG. 4 is a diagram illustrating in detail the compensation circuit 300 of FIG. 1.

Referring to FIG. 4, the compensation circuit 300 may include a calculator 310 and a compensation code output circuit 320.

The calculator 310 may output a calculation code (i.e., operation code) CODE_cal<n:0> as a result of digitally calculating the digital code CODE<n:0>. For example, the calculator 310 may calculate first difference values between real temperature voltages Vctat from the digital code CODE<n:0> and ideal temperature voltages Vctat_des, and may obtain a slope based on a minimum difference value and a maximum difference value of the first difference values. Thereafter, the calculator 310 may obtain an intersection point at which an oblique line having the slope intersects the first difference value curve, and output the calculation code CODE_cal<n:0> based on second difference values between the slope and the first difference values. For example, the calculator 310 may obtain the second difference values by calculating differences between ordinate value of the oblique line and corresponding ordinate value of the first difference value curve in a region between the minimum difference value and the intersection point and a region between the intersection point and a center difference value.

The compensation circuit 300 may directly output the operation code CODE_cal<n:0> that is outputted from the calculator 310, as a compensation code CP<n:0> by bypassing the compensation code output circuit 320, or may output the compensation code CP<n:0> by filtering or amplifying the operation code CODE_cal<n:0> through the compensation code output circuit 320.

The calculation method performed by the calculator 310 will be described in detail below.

Figure 5:
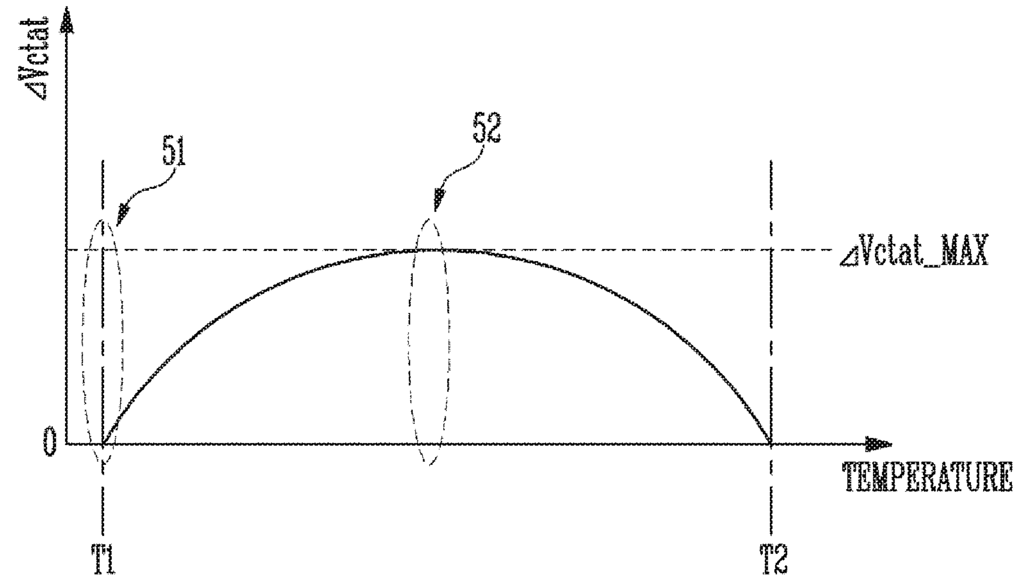
FIGS. 5 to 7 are diagrams illustrating in detail a calculation method performed by a calculator.
Figure 6:
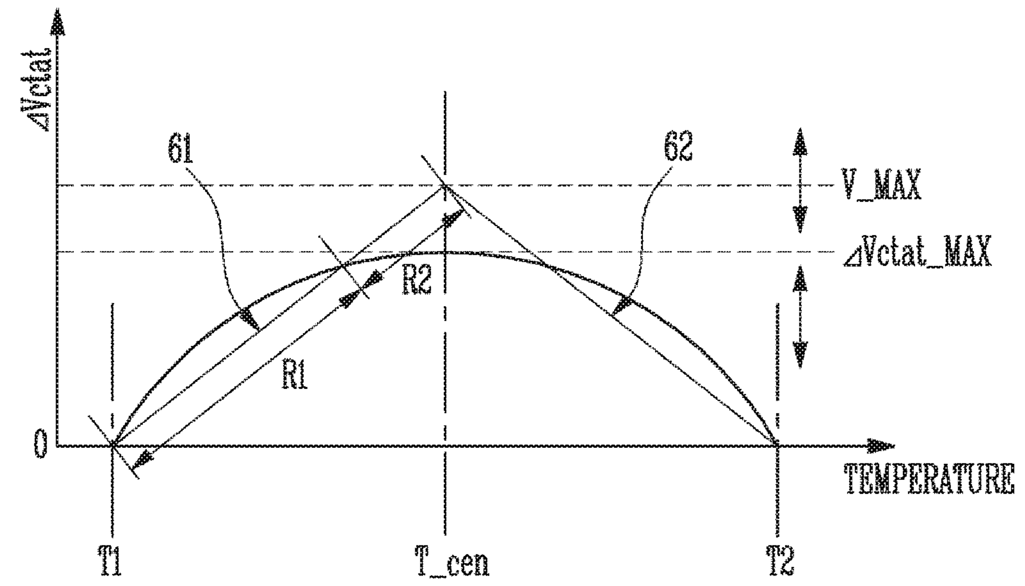
Figure 7:
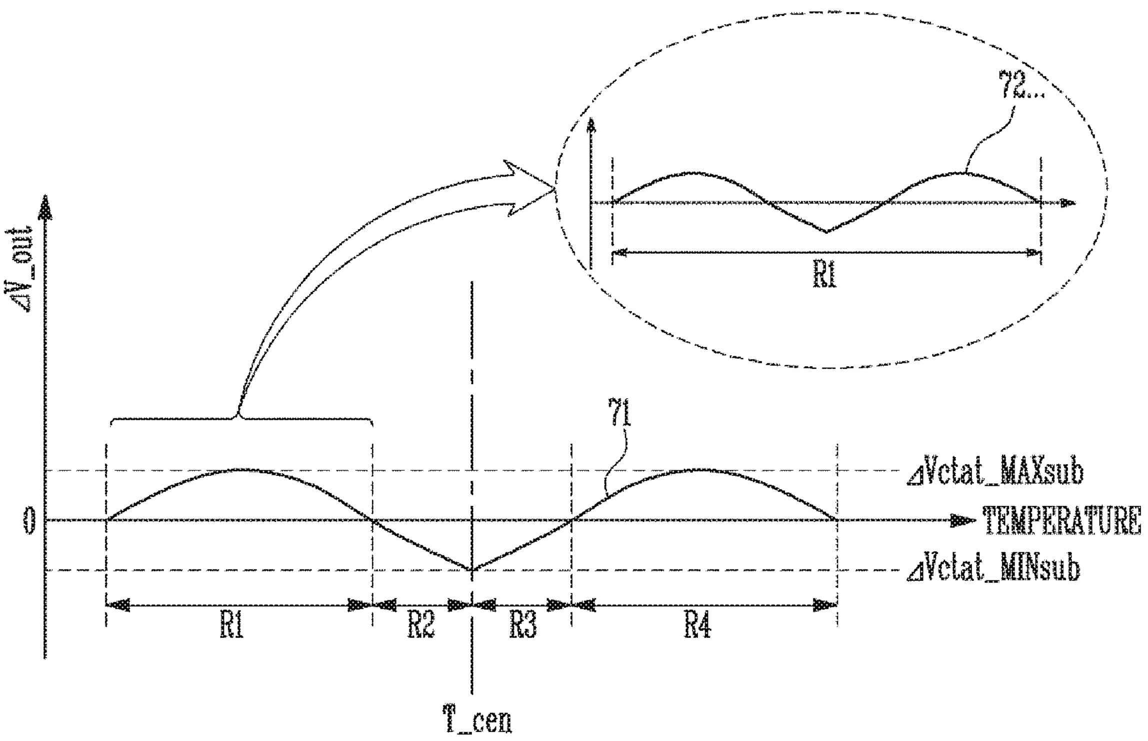

FIGS. 5 to 7 are diagrams illustrating a calculation method performed by the calculator 310 of FIG. 4.

Referring to FIG. 5, the calculator 310 may calculate first difference values ΔVctat between real temperature voltages Vctat from a digital code CODE<n:0>, which is provided from the analog-digital converter 200, and ideal temperature voltages Vctat_des. For this operation, the calculator 310 may include a register in which the values of ideal temperature voltages Vctat_des are stored.

The calculator 310 may generate the first difference values ΔVctat by subtracting the ideal temperature voltages Vctat_des from the real temperature voltages Vctat. The first difference values make the first difference value curve.

For example, at temperature point 31 of FIG. 3, a first difference value ΔVctat is relatively small, which is also shown at temperature point T1 (also shown by reference numeral 51). However, at temperature point 32 of FIG. 3, a first difference value ΔVctat is relatively large, which is also shown at a section 52 between temperature points T1 and T2.

When the real temperature voltages Vctat form a curve as that illustrated in FIG. 3, the first difference values ΔVctat may be the smallest at the temperature points T1 and T2 as illustrated in FIG. 5, and may be the largest at the section 52 between the temperature points T1 and T2. Among the first difference values ΔVctat, the largest value may be defined as a maximum difference value ΔVctat_MAX at the section 52 between the temperature points T1 and T2.

The first difference values ΔVctat may be represented as the curve graph as illustrated in FIG. 5. The smaller the difference between the real temperature voltages Vctat and the ideal temperature voltages Vctat_des, the smaller the curvature of the curve of the first difference values ΔVctat. The maximum difference value ΔVctat_MAX may also vary depending on the differences between the real temperature voltages Vctat and the ideal temperature voltages Vctat_des. Therefore, the smaller the difference between the real temperature voltages Vctat and the ideal temperature voltages Vctat_des, the smaller the maximum difference value ΔVctat_MAX.

Referring to FIG. 6, the calculator 310 may obtain first and second slopes 61 and 62 from the minimum difference values and the maximum difference value ΔVctat_MAX of the first difference values ΔVctat. Since the first difference values ΔVctat form the curve, the minimum difference values of the first difference values ΔVctat may be values at both ends of the curve, that is, the two temperature points T1 and T2. The calculator 310 may set a center difference value V_MAX higher than the maximum difference value ΔVctat_MAX, and may calculate first and second slopes 61 and 62 between the temperature point of the center difference value V_MAX and the temperature points of the minimum difference values. The center difference value V_MAX may be set at the center point T_cen of the temperature points T1 and T2 having the minimum difference values of the first difference values ΔVctat. The level of the center difference value V_MAX may be higher than the maximum difference value ΔVctat_MAX by a preset change value.

The preset change value may be predetermined and stored in the calculator 310. Alternatively, the preset change value may be predetermined and stored in a controller (e.g., a memory controller) for controlling the temperature sensing circuit 1000. Here, the calculator 310 may read the preset change value from the memory controller and may use the preset change value during the calculation operation. Since the maximum difference value ΔVctat_MAX may vary depending on the temperature voltages Vctat outputted from the analog voltage generation circuit 100, the center difference value V_MAX may also vary depending on the maximum difference value ΔVctat_MAX. However, even if the maximum difference value ΔVctat_MAX and the center difference value V_MAX vary, the difference between the maximum difference value ΔVctat_MAX and the center difference value V_MAX may be fixed the preset change value.

The preset change value may be set such that each of the first and second slopes 61 and 62 obtained from one of the minimum difference values and the maximum difference value ΔVctat_MAX meets the curve of the first difference values ΔVctat at two temperature points (hereinafter, referred to as first and second intersection points).

As exemplified in FIG. 6, the first slope 61 obtained from the temperature point T1 having the minimum difference value and center point T_cen having the maximum difference value ΔVctat_MAX meets the curve of the first difference values ΔVctat at the temperature point T1 and a temperature point between the temperature point T1 and the center point T_cen, which are respectively the first and second intersection points.

A first region R1 may be defined as formed by the first and second intersection points at which the first slope 61 meets the curve of the first difference values ΔVctat. A second region R2 may be defined as formed by the second intersection point and the center point T_cen having the maximum difference value ΔVctat_MAX. That is, the first slope 61 may be divided into the first and second regions R1 and R2.

Similarly, the second slope 62 obtained from the other temperature point T2 also having the minimum difference value and the center point T_cen having the maximum difference value ΔVctat_MAX meets the curve of the first difference values ΔVctat at the temperature point T2 and a temperature point between the temperature point T2 and the center point T_cen, which are respectively the first and second intersection points. In the second slope 62, a fourth region R4 may be defined as formed by the first and second intersection points at which the second slope 62 meets the curve of the first difference values ΔVctat. A third region R3 may be defined as formed by the second intersection point and the center point T_cen having the maximum difference value ΔVctat_MAX. The third and fourth regions R3 and R4 are shown in FIG. 7.

Referring to FIG. 7, the calculator 310 may obtain difference values between the first slope 61 and the first difference values in the first region R1, and difference values between the first slope 61 and the first difference values in the second region R2.

The difference values between the first slope 61 and the first difference values in the first region R1 are defined as first sub-difference values, and the difference values between the first slope 61 and the first difference values in the second region R2 are defined as second sub-difference values.

The calculator 310 may obtain third and fourth sub-difference values in the third and fourth region R3 and R4 in a similar way by using the second slope 62.

Accordingly, in the first region R1, there may be a sub-maximum difference value ΔVctat_MAXsub between a minimum difference value and a maximum difference value. In the second region R2, there may be a sub-minimum difference value ΔVctat_MINsub between a minimum difference value and a maximum difference value. Similarly, in the third region R3, there may be the sub-minimum difference value ΔVctat_MINsub between a minimum difference value and a maximum difference value. In the fourth region R4, there may be the sub-maximum difference value ΔVctat_MAXsub between a minimum difference value and a maximum difference value. The sub-maximum difference value ΔVctat_MAXsub may have a positive voltage level, and the sub-minimum difference value ΔVctat_MINsub may have a negative voltage level.

As described above, the first difference values are divided into a plurality of regions R1 to R4, and are calculated with the reference values in respective regions, and thus the difference values may be decreased. For example, the absolute value of the sub-maximum difference value ΔVctat_MAXsub and the absolute value of the sub-minimum difference value ΔVctat_MINsub are less than the absolute value of the maximum difference value ΔVctat_MAX. Therefore, before the calculation operation, a first difference value is as large as the maximum difference value ΔVctat_MAX, as illustrated in FIG. 5. However, after the above-described operation has been performed, the first difference value may be reduced to a difference value between the sub-maximum difference value ΔVctat_MAXsub and the sub-minimum difference value ΔVctat_MINsub, as illustrated in FIG. 7.

Further, the calculation method, described above with reference to FIGS. 5 to 7, may be repeated in the first to fourth regions R1 to R4, respectively, and thus the difference value may be further reduced, as indicated by '72'.

The calculator 310 may output the operation code CODE_cal<n:0> representing the first to fourth sub-difference values.

The compensation circuit 300 may directly output the operation code CODE_cal<n:0> as the compensation code CP<n:0> by bypassing the compensation code output circuit 320.

The voltage generation circuit 400 may output the output voltage V_out according to the compensation code CP<n:0>, which is the operation code CODE_cal<n:0>.

Figure 8:
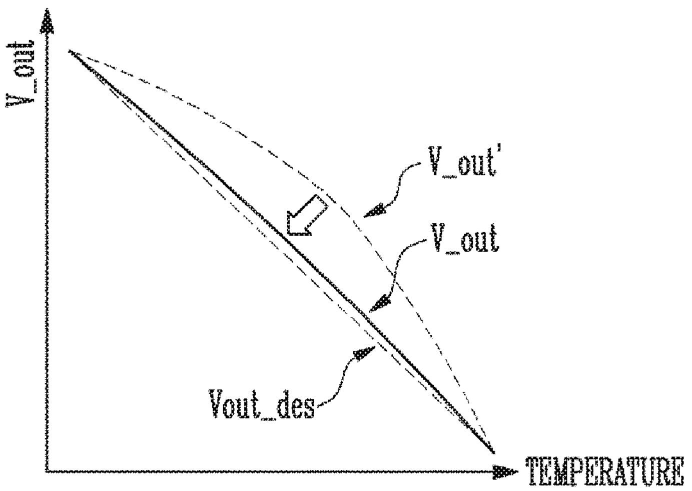
FIG. 8 is a diagram explaining output voltages according to an embodiment of the present disclosure.

FIG. 8 is a diagram explaining output voltages according to an embodiment of the present disclosure.

Referring to FIG. 8, the temperature sensing circuit 1000 may output the compensation code CP<n:0>, obtained by adjusting a digital code CODE<n:0> through the calculation operation described above with reference to FIGS. 5 to 7, and thus the voltage generation circuit 400 may provide the output voltages V_out approximate to the ideal temperature voltages Vctat_des.

Figure 9:
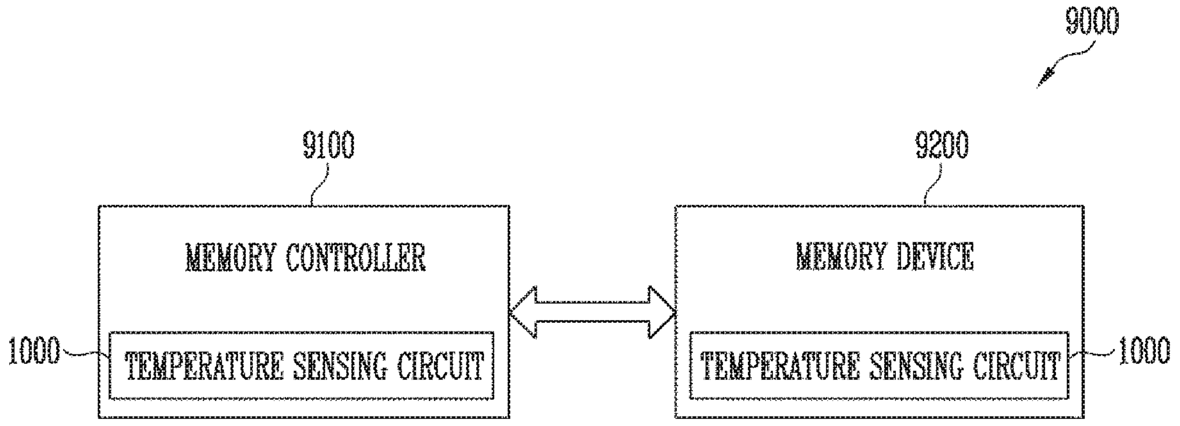
FIG. 9 is a diagram illustrating an embodiment of a semiconductor device having a temperature sensing circuit according to the present disclosure.

FIG. 9 is a diagram illustrating an embodiment of a semiconductor device having a temperature sensing circuit according to an embodiment of the present disclosure.

Referring to FIG. 9, a semiconductor device 9000 may include a memory device 9200 in which data is stored and a memory controller 9100 which controls the memory device 9200. The above-described temperature sensing circuit 1000 may be included in each of the memory device 9200 and the memory controller 9100, or may be included in any one of the memory device 9200 and the memory controller 9100.

When the temperature sensing circuit 1000 is included in the memory device 9200, the memory device 9200 may provide output voltages V_out using the compensation code CP<n:0> that is outputted depending on internal temperature.

When the temperature sensing circuit 1000 is included in the memory controller 9100, the memory controller 9100 may provide output voltages V_out using the compensation code CP<n:0> that is outputted depending on internal temperature. Also, when a single memory controller 9100 controls a plurality of memory devices 9200, the memory controller 9100 may monitor the temperature of any one of the memory devices 9200 and may provide output voltages V_out according to the compensation code CP<n:0> that is outputted from the temperature sensing circuit 1000 based on the result of the monitoring.

Figure 10:
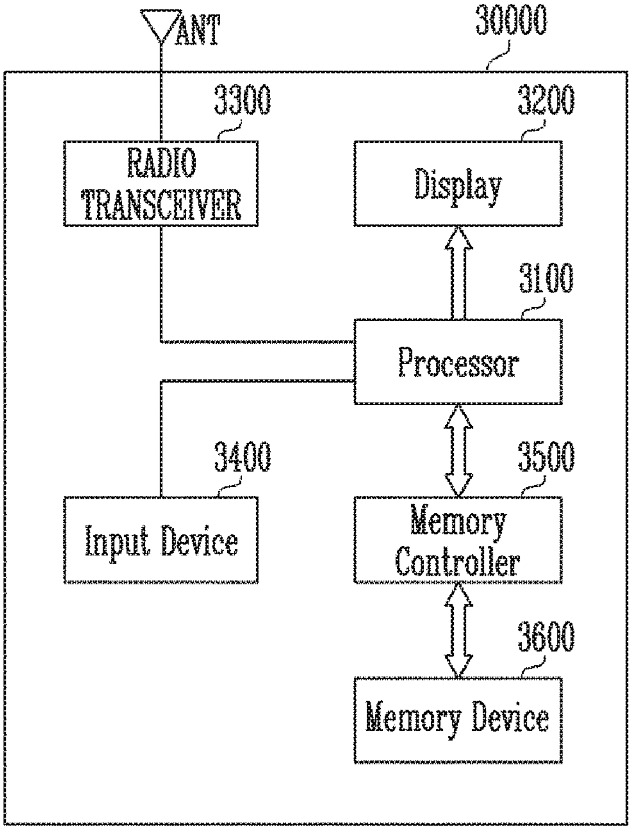
FIGS. 10 to 13 are diagrams illustrating various application examples of memory systems according to one or more embodiments of the present disclosure.

FIG. 10 is a diagram illustrating a memory system according to an embodiment of the present disclosure.

Referring to FIG. 10, a memory system 30000 may be implemented as a cellular phone, a smart phone, a tablet PC, a personal digital assistant (PDA) or a wireless communication device. The memory system 30000 may include a memory device 3600 and a memory controller 3500 that is capable of controlling the operation of the memory device 3600. Here, the memory controller 3500 and the memory device 3600 may be respectively implemented as the memory controller 9100 and the memory device 9200, described above with reference to FIG. 9.

The memory controller 3500 may control a data access operation for the memory device 3600, for example, a program operation, an erase operation or a read operation under the control of a processor 3100.

Data programmed to the memory device 3600 may be outputted via a display 3200 under the control of the memory controller 3500.

A radio transceiver 3300 may exchange radio signals through an antenna ANT. For example, the radio transceiver 3300 may change a radio signal received through the antenna ANT into a signal which may be processed in the processor 3100. Therefore, the processor 3100 may process a signal outputted from the radio transceiver 3300 and transmit the processed signal to the memory controller 3500 or the display 3200. The memory controller 3500 may transmit the signal processed by the processor 3100 to the memory device 3600. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data outputted from the memory controller 3500, data outputted from the radio transceiver 3300, or data outputted from the input device 3400 is outputted via the display 3200.

In an embodiment, the memory controller 3500 capable of controlling the operation of the memory device 3600 may be implemented as a part of the processor 3100 or a chip provided separately from the processor 3100.

Figure 11:
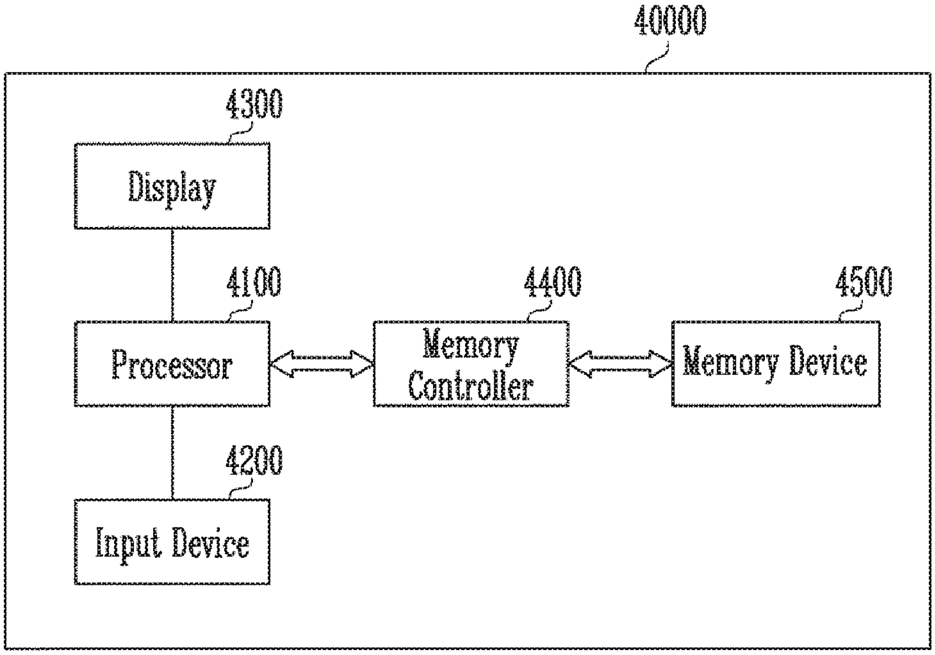

FIG. 11 is a diagram illustrating a memory system according to an embodiment of the present disclosure.

Referring to FIG. 11, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 4500 and a memory controller 4400 that is capable of controlling a data processing operation of the memory device 4500. Here, the memory controller 4400 and the memory device 4500 may be respectively implemented as the memory controller 9100 and the memory device 9200, described above with reference to FIG. 9.

A processor 4100 may output data stored in the memory device 4500 via a display 4300 according to data inputted from an input device 4200. For example, the input device 4200 may be implemented as a pointing device such as a touch pad or a computer mouse, a keypad or a keyboard.

The processor 4100 may control the overall operation of the memory system 40000 and control the operation of the memory controller 4400. In an embodiment, the memory controller 4400 capable of controlling the operation of the memory device 4500 may be implemented as a part of the processor 4100 or a chip provided separately from the processor 4100.

Figure 12:
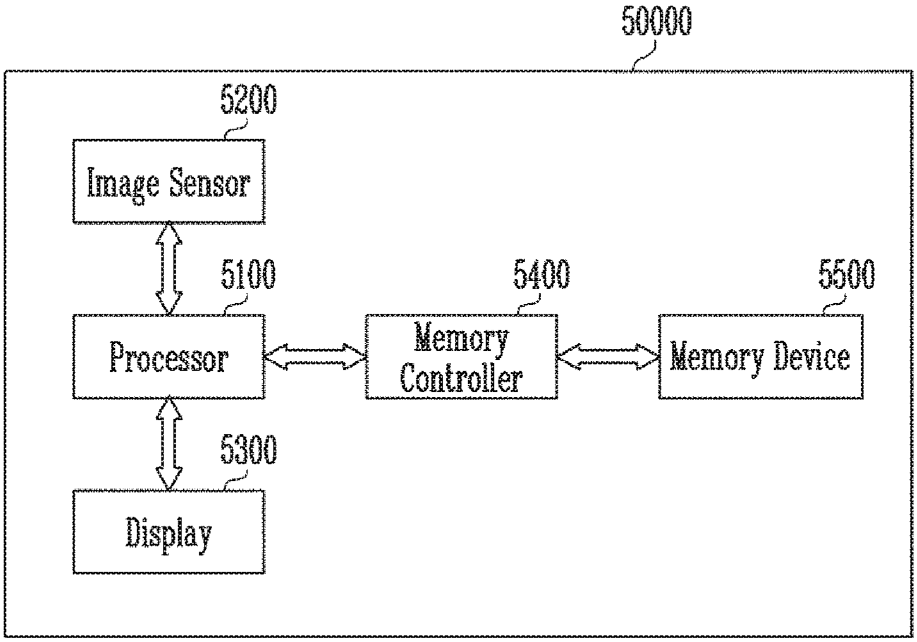

FIG. 12 is a diagram illustrating a memory system according to an embodiment of the present disclosure.

Referring to FIG. 12, a memory system 50000 may be embodied in an image processing device, e.g., a digital camera, a mobile phone provided with a digital camera, a smartphone provided with a digital camera, or a tablet PC provided with a digital camera.

The memory system 50000 may include a memory device 5500 and a memory controller 5400 that is capable of controlling a data processing operation of the memory device 5500, e.g., a program operation, an erase operation or a read operation. Further, the memory controller 5400 and the memory device 5500 may be respectively implemented as the memory controller 9100 and the memory device 9200, described above with reference to FIG. 9.

An image sensor 5200 of the memory system 50000 may convert an optical image into digital signals. The converted digital signals may be transmitted to a processor 5100 or the memory controller 5400. Under the control of the processor 5100, the converted digital signals may be outputted via a display 5300 or stored in the memory device 5500 through the memory controller 5400. Data stored in the memory device 5500 may be outputted via the display 5300 under the control of the processor 5100 or the memory controller 5400.

In an embodiment, the memory controller 5400 capable of controlling the operation of the memory device 5500 may be implemented as a part of the processor 5100, or a chip provided separately from the processor 5100.

Figure 13:
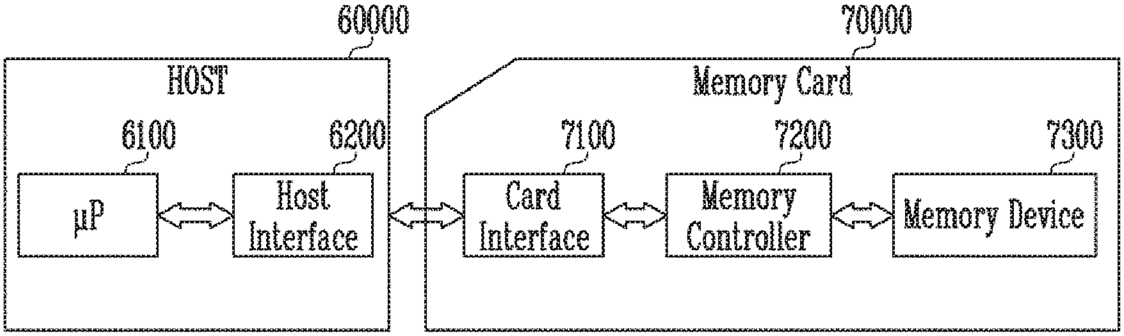

FIG. 13 is a diagram illustrating a memory system according to an embodiment of the present disclosure.

Referring to FIG. 13, a memory system 70000 may be embodied in a memory card or a smart card. The memory system 70000 may include a memory device 7300, a memory controller 7200, and a card interface 7100. The memory controller 7200 and the memory device 7300 may be respectively implemented as the memory controller 9100 and the memory device 9200, described above with reference to FIG. 9.

The memory controller 7200 may control data exchange between the memory device 7300 and the card interface 7100. In an embodiment, the card interface 7100 may be, but is not limited to, a secure digital (SD) card interface or a multi-media card (MMC) interface.

The card interface 7100 may be an interface performing data exchange between a host 60000 and the memory controller 7200 according to a protocol of the host 60000. In an embodiment, the card interface 7100 may support a universal serial bus (USB) protocol and an inter-chip (IC)-USB protocol. Here, the card interface may refer to hardware capable of supporting a protocol which is used by the host 60000, software installed in the hardware, or a signal transmission method.

When the memory system 70000 is coupled to a host interface 6200 of the host 60000, such as a PC, a tablet PC, a digital camera, a digital audio player, a mobile phone, console video game hardware or a digital set-top box, the host interface 6200 may perform data communication with the memory device 7300 through the card interface 7100 and the memory controller 7200 under the control of a microprocessor (μP) 6100.

The present disclosure may remove noise from a voltage that is outputted depending on temperature by varying a code outputted from a temperature sensing circuit through digital calculation, thus improving the reliability of the temperature sensing circuit.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A temperature sensing circuit, comprising:

an analog voltage generation circuit configured to convert a temperature into a voltage and output a temperature voltage;

an analog-digital converter configured to convert the temperature voltage into a digital code; and a compensation circuit configured to adjust the digital code and then output an operation code to remove noise from the temperature voltage, wherein the analog voltage generation circuit comprises:

a reference current generation circuit configured to generate a reference current based on a reference voltage; and a voltage conversion circuit configured to output the temperature voltage that is inversely proportional to temperature based on the reference current.

2. The temperature sensing circuit according to claim 1, wherein the voltage conversion circuit comprises a bipolar junction transistor (BJT).

3. The temperature sensing circuit according to claim 1, wherein the analog-digital converter outputs the digital code in n-bit data, where n is a positive integer.

4. The temperature sensing circuit according to claim 1, wherein the analog-digital converter is implemented as a high-resolution analog-to-digital converter (ADC).

5. The temperature sensing circuit according to claim 1, wherein the analog-digital converter generates the digital code having a resolution of at least 10 bits.

6. The temperature sensing circuit according to claim 1, wherein the compensation circuit comprises a calculator configured to adjust the digital code into the operation code by performing a digital calculation operation and to output the operation code.

7. The temperature sensing circuit according to claim 6, wherein the compensation circuit further comprises a compensation code output circuit configured to output a compensation code by filtering or amplifying the operation code.

8. The temperature sensing circuit according to claim 6, wherein the calculator calculates first difference values between real temperature voltages from the digital code and ideal temperature voltages, obtains a first difference value curve based on the first difference values relative to a change of temperature, calculates a slope based on a minimum difference value and a maximum difference value of the first difference values, obtains an intersection point at which an oblique line having the slope intersects the first difference value curve, and then outputs the operation code based on second difference values obtained by calculating differences between oblique line and the first difference values.

9. The temperature sensing circuit according to claim 8, wherein each of the real temperature voltages is the temperature voltage outputted from the analog voltage generation circuit.

10. The temperature sensing circuit according to claim 8, wherein the first difference values form a curve due to nonlinear characteristics of the temperature voltages.

11. The temperature sensing circuit according to claim 8, wherein the calculator is configured to obtain the second difference values by calculating differences between an ordinate value of the oblique line and a corresponding ordinate value of the first difference value curve in a region between the minimum difference value and the intersection point and a region between the intersection point and a center difference value.

12. A semiconductor device, comprising:

a temperature sensing circuit configured to convert a temperature into a digital code, adjust the digital code through a digital calculation operation, and then output an operation code; and a voltage generation circuit configured to output a voltage depending on the operation code.

13. The semiconductor device according to claim 12, wherein the temperature sensing circuit comprises:

an analog voltage generation circuit configured to convert the temperature into a voltage and output a temperature voltage;

an analog-digital converter configured to convert the temperature voltage into the digital code; and a compensation circuit configured to generate the operation code in which the digital code is adjusted by performing the digital calculation operation to remove noise from the temperature voltage.

14. The semiconductor device according to claim 13, wherein the analog voltage generation circuit comprises:

a reference current generation circuit configured to generate a reference current based on a reference voltage; and a voltage conversion circuit configured to output the temperature voltage that is inversely proportional to temperature depending on the reference current.

15. The semiconductor device according to claim 13, wherein the analog-digital converter is implemented as a high-resolution analog-to-digital converter (ADC).

16. The semiconductor device according to claim 13, wherein the compensation circuit comprises a calculator configured to adjust the digital code into the operation code by performing the digital calculation operation and to output the operation code.

17. The semiconductor device according to claim 16, wherein the compensation circuit further comprises a compensation code output circuit configured to output a compensation code by filtering or amplifying the operation code.

18. The semiconductor device according to claim 16, wherein the calculator calculates first difference values between real temperature voltages from the digital code and ideal temperature voltages, obtains a first difference value curve based on the first difference values relative to a change of temperature, obtains a slope based on a minimum difference value and a maximum difference value of the first difference values, obtains an intersection point at which an oblique line having the slope intersects the first difference value curve, and then outputs the operation code based on second difference values obtained by calculating differences between the oblique line and the first difference values.

19. The semiconductor device according to claim 18, wherein the calculator is configured to obtain the second difference values by calculating differences between an ordinate value of the oblique line and a corresponding ordinate value of the first difference value curve in a region between the minimum difference value and the intersection point and a region between the intersection point and a center difference value.

* * * * *